(12) United States Patent
Dally (10) Patent No.: US 8,373,483 B2
(45) Date of Patent: Feb. 12, 2013

(54) LOW-CLOCK-ENERGY, FULLY-STATIC LATCH CIRCUIT

(75) Inventor: William J. Dally, Stanford, CA (US)

(73) Assignee: NVIDIA Corporation, Santa Clara, CA (US)

( * ) Notice: Subject to any disclaimer, the term of this patent is extended or adjusted under 35 U.S.C. 154(b) by 67 days.

(21) Appl. No.: 13/028,023

(22) Filed: Feb. 15, 2011

(65) Prior Publication Data

US 2012/0206182 A1    Aug. 16, 2012

(51) Int. Cl.
*H03K 3/289* (2006.01)
(52) U.S. Cl. ......... 327/202; 327/199; 327/200; 327/203
(58) Field of Classification Search .................. 327/199, 327/202, 203
See application file for complete search history.

(56) References Cited

U.S. PATENT DOCUMENTS

| | | | |
|---|---|---|---|
| 5,619,511 A * | 4/1997 | Sugisawa et al. ............. | 714/726 |
| 5,889,422 A | 3/1999 | Komoike et al. | |
| 6,614,268 B2 * | 9/2003 | Dally et al. ..................... | 327/51 |
| 6,714,060 B2 | 3/2004 | Araki | |
| 2010/0176860 A1 * | 7/2010 | Chen et al. .................... | 327/218 |

OTHER PUBLICATIONS

International Search Report, Application No. GB 1202517.7, dated Jun. 7, 2012.

* cited by examiner

*Primary Examiner* — John Poos
(74) *Attorney, Agent, or Firm* — Zilka-Kotab, PC

(57) ABSTRACT

One embodiment of the present invention sets forth a technique for capturing and holding a level of an input signal using a low-clock-energy latch circuit that is fully static. The clock is only coupled to a first clock-activated pull-up or pull-down transistor and a second clock-activated pull-down or pull-up transistor. The level of the input signal is captured by a storage sub-circuit on one of the rising or the falling clock edge and stored to generate an output signal until the clock transitions. The level of the input signal is propagated to the output signal when the storage sub-circuit is not enabled. The storage sub-circuit is enabled and disabled by the first clock-activated transistor and a propagation sub-circuit is activated and deactivated by the second clock-activated transistor.

19 Claims, 7 Drawing Sheets

PRIOR ART

Latch
100

LOW-CLOCK-ENERGY, FULLY-STATIC LATCH CIRCUIT

BACKGROUND OF THE INVENTION

1. Field of the Invention

The present invention generally relates to digital latch circuits and more specifically to a low-clock-energy latch circuit that is fully-static.

2. Description of the Related Art

Power dissipation is a significant problem in conventional integrated circuits. In many applications, the performance of integrated circuit devices is limited by the amount of energy consumed by the circuitry implementing a function rather than by the die area of the circuitry. A large fraction of the power dissipated in conventional digital integrated circuits is consumed in the clock network. The amount of energy that is consumed by flip-flops due to data transitions is small because the activity factor, the fraction of time the data input of the flip-flop toggles, is quite low, typically about 5-10%. In contrast, the clock input load and clock energy is a particularly important metric for determining the energy that is consumed by the latches and flip-flops. Hence reducing the clock-switched capacitance by a given amount produces 10-20× the power savings compared with reducing the data-switched capacitance by the same amount.

Conventional latches are often built as a pass-gate latch with tri-state feedback to produce a static circuit. Such a design requires a local clocked inverter (or two) to produce both polarities of the clock and has two clock loads on each of the pass gate and the feedback gate giving a total clock load of six or eight transistor devices.

Figure 1:
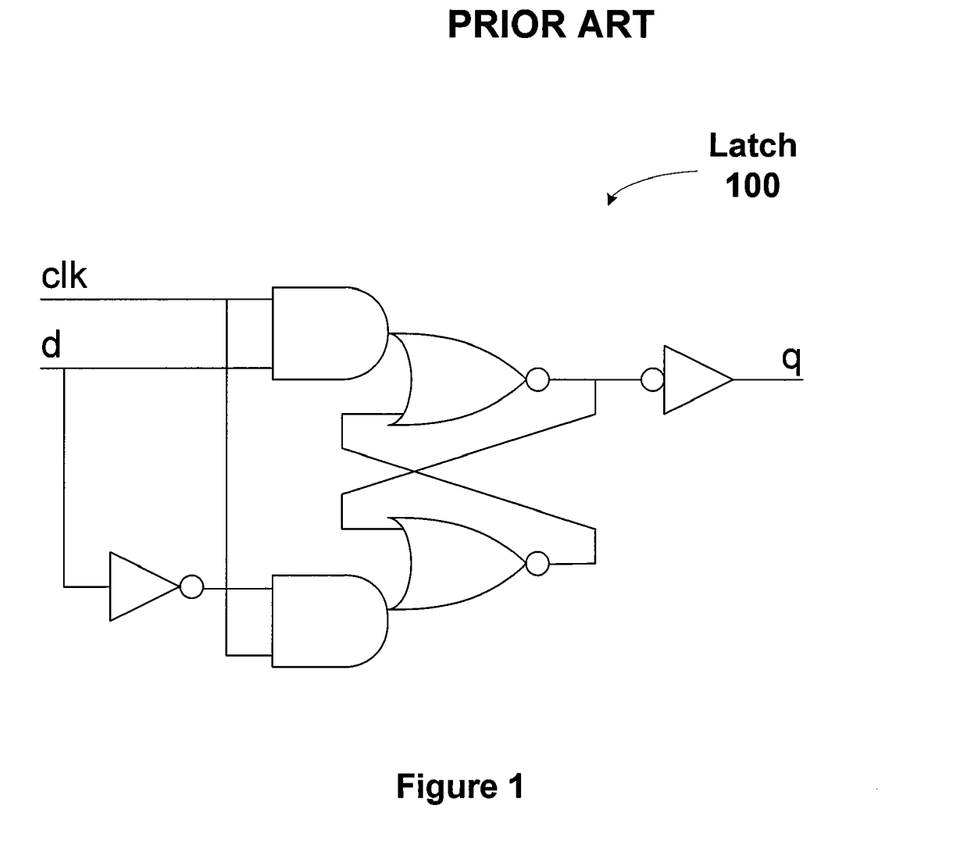
FIG. 1 illustrates a conventional latch, according to the prior art.

FIG. 1 illustrates a conventional NOR latch 100 implemented with AND-OR-Invert (AOI) gates. The latch 100 is transparent when the clk (clock) input is high, so that the d input passes through to the q output. When the clk input is low the level of the d input is stored and q maintains the stored level of the d input at the q output. Each of the AND gates presents a clock load of two transistor gates, for a total clock load of four transistor devices.

Figure 2:
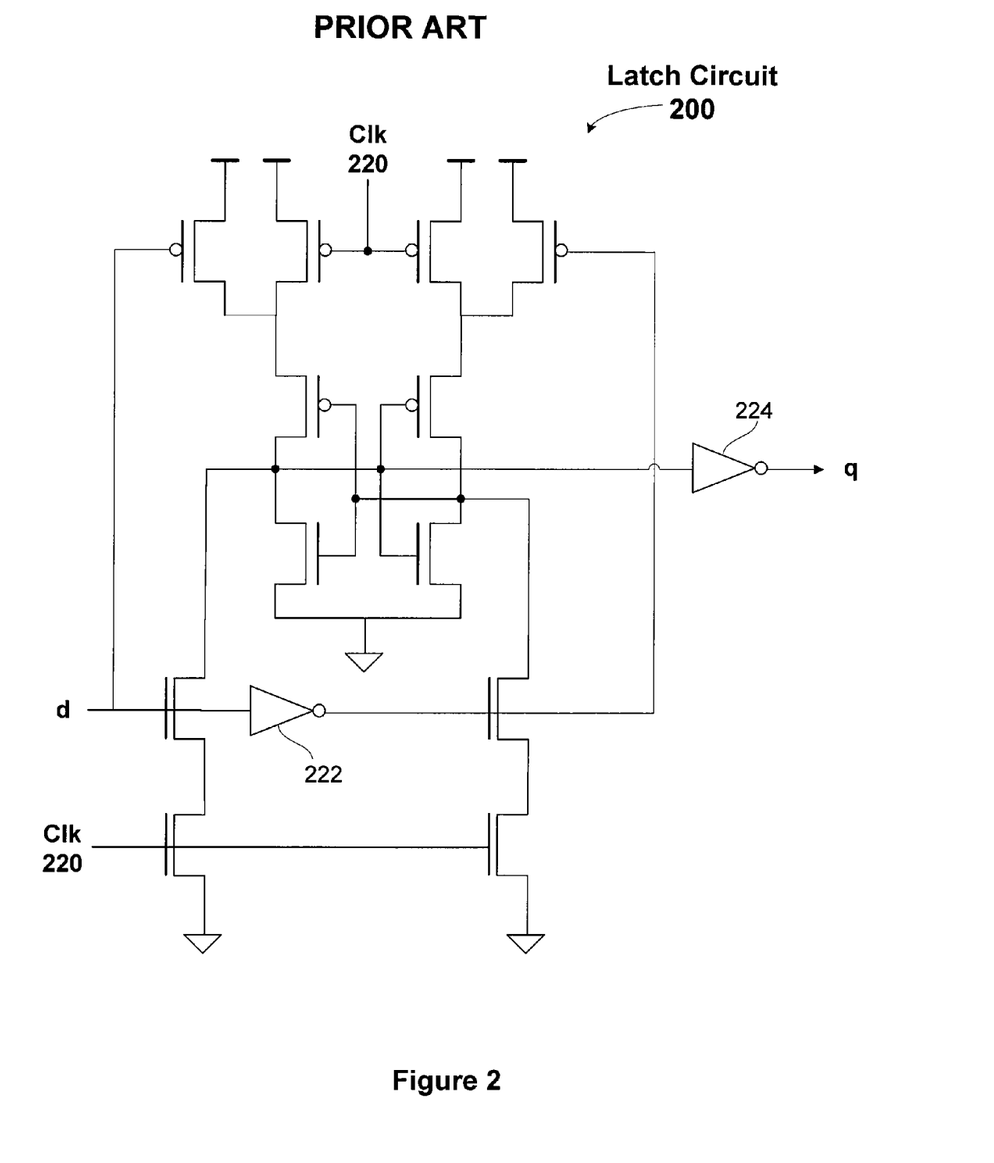
FIG. 2 illustrates a circuit corresponding to the conventional latch shown in FIG. 1, according to the prior art.

FIG. 2 illustrates a latch circuit 200 corresponding to the conventional latch 100 shown in FIG. 1. The total clock load presented to Clk 220 is four transistor devices. The total number of transistors is sixteen, where each of inverters 222 and 224 include two transistors.

Accordingly, what is needed in the art is a latch circuit that reduces the clock energy by reducing the capacitance of clock loads. Additionally, the latch circuit should function independent of fabrication process variations.

SUMMARY OF THE INVENTION

One embodiment of the present invention sets forth a technique for capturing and holding a level of an input signal using a low-clock-energy latch circuit that is fully static. The clock is only coupled to a first clock-activated pull-up or pull-down transistor and a second clock-activated pull-down or pull-up transistor. The level of the input signal is captured by a storage sub-circuit on one of the rising or the falling clock edge and stored to generate an output signal until the clock transitions. The level of the input signal is propagated to the output signal when the storage sub-circuit is not enabled. The storage sub-circuit is enabled and disabled by the first clock-activated transistor and a propagation sub-circuit is activated and deactivated by the second clock-activated transistor.

Various embodiments of the invention comprise a low-clock-energy and fully-static latch circuit that includes a storage sub-circuit and a propagation sub-circuit. A clock signal is coupled only to a first clock-activated pull-up transistor and a second clock-activated pull-down transistor included in the low-clock-energy and fully-static latch circuit. The storage sub-circuit is configured to capture a level of an input signal when the clock signal transitions from high to low and hold the level to generate an output signal while the clock signal is low, where the first clock-activated pull-up transistor enables the storage sub-circuit when the clock signal is low and disables the storage sub-circuit when the clock signal is high. The propagation sub-circuit is configured to receive the input signal and propagate the level of the input signal to generate the output signal while the clock signal is high, where the second clock-activated pull-down transistor activates the propagation sub-circuit when the clock signal is high and deactivates the propagation sub-circuit when the clock signal is low.

One advantage of the disclosed latch circuit is that the transistor device load is reduced to only two transistor gates. Therefore the clock energy is reduced significantly compared with latch circuit having greater loads on the clock signal. The latch circuit is also completely static and does not rely on sizing relationships between the different transistors. Therefore, the latch circuit operation is robust, even when the characteristics of the transistors vary due to the fabrication process.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

In the following description, numerous specific details are set forth to provide a more thorough understanding of the present invention. However, it will be apparent to one of skill in the art that the present invention may be practiced without one or more of these specific details. In other instances, well-known features have not been described in order to avoid obscuring the present invention.

Figure 3A:
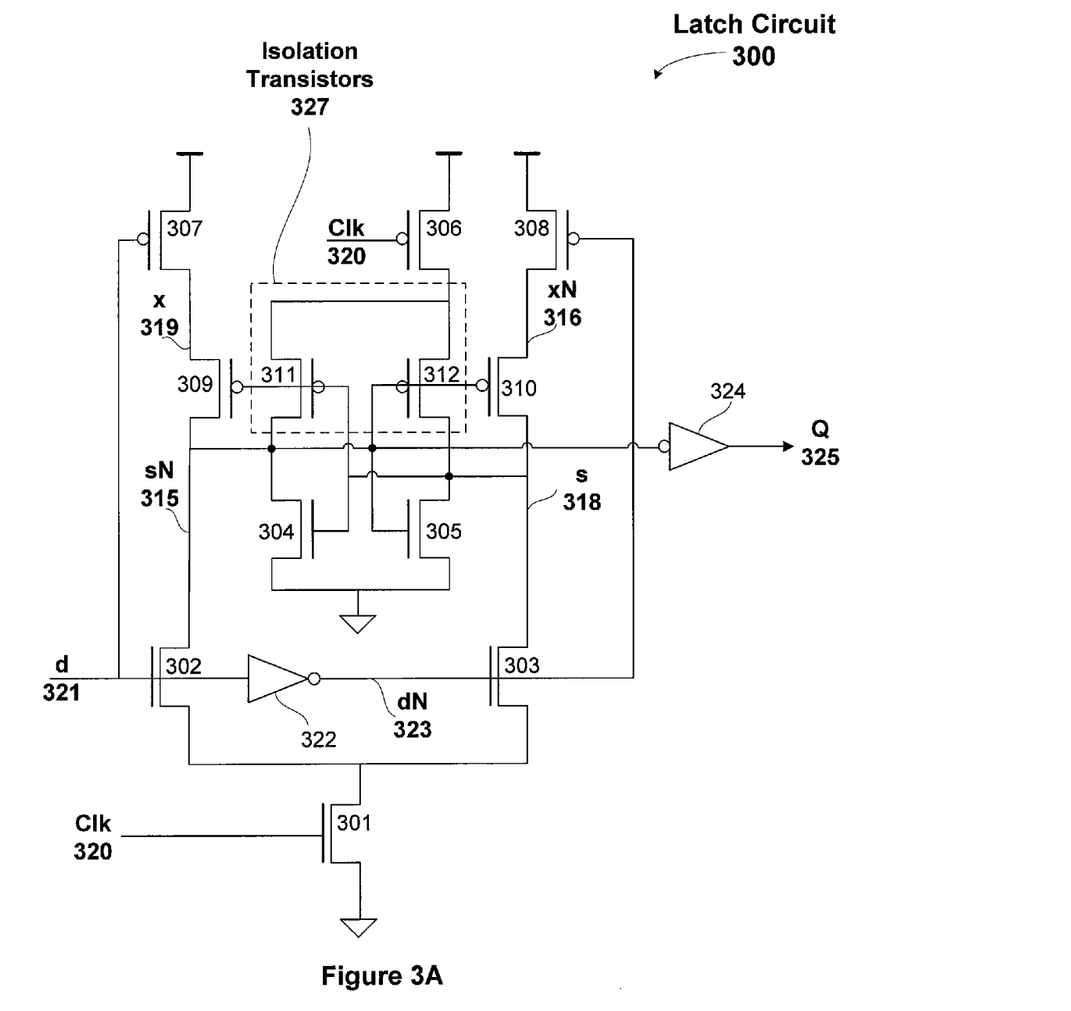
FIG. 3A illustrates a low-clock-energy latch circuit that is transparent when the clock signal is high, according to one embodiment of the invention.

FIG. 3A illustrates a low-clock-energy latch circuit 300 that is transparent when the clock signal, Clk 320 is high, according to one embodiment of the invention. The latch circuit 300 is a fully-static, clock-energy-efficient latch that presents only two loads to the clock and which does not depend on transistor device size ratios. With only two minimum sized clock loads, the latch circuit 300 should consume only a third or a quarter of the clock energy that is consumed by a conventional pass-gate latch. The total number of transistors included in the latch circuit 300 is sixteen, where each of inverters 322 and 324 include two transistors. Compared with the latch circuit 200, having the same number of transistors, the loads on the clock are halved.

As shown in FIG. 3A transistors 301, 302, 303, 304, and 305 are NMOS devices and transistors 306, 307, 308, 309, 310, 311, and 312 are PMOS devices. Transistors 304, 305, 311, and 312 are configured as cross-coupled inverters that form a storage sub-circuit. A first inverter includes transistors 311 and 304 and a second inverter includes transistors 312 and 305. The transistor 306 is a clock-enabled pull-up transistor that is configured to enable the storage sub-circuit by allowing current to flow from the supply voltage through either transistor 311 or 312 when the clock is low. The transistor 306 is shared between both inverters of the storage sub-circuit. Transistors 302, 303, 307, 308, 309, 310, and inverter 322 form propagation circuitry that passes the input signal d 321 to the output signal Q 325. The inverter 324 isolates Q 325 from the storage feedback loop of the storage sub-circuit. When setup timing is not critical, synchronization performance is not important, and the load on the output Q 325 is low and static, inverter 324 may be omitted.

The transistor 301 is a clock-enabled pull-down transistor that is configured to activate the propagation circuitry to pass the input signal d 321 through to the output signal Q 325 when the clk 320 is high. Transistor 301 and transistor 306 are opposite polarities so that either the storage sub-circuit is enabled or the propagation circuitry is active in order to produce a fully-static circuit. Transistors 311 and 312 are isolation transistors 327. The gate and drain of transistor 311 are tied in parallel with the gate and drain of transistor 309. This duplication provides two source terminals, one on transistor 311 and one on transistor 309 that pull up sN 315 when s 318 is low. Splitting these source terminals isolates the drain of transistor 307 from the drain of the clock-enabled pull-up transistor 306. Similarly, the gate and drain of transistor 312 are tied in parallel with the gate and drain of transistor 310 and transistor 312 is configured to isolate the drain of transistor 308 from the shared clock-enabled pull-up transistor 306. Nodes x 319 and xN 316 are isolated from the shared clock-enabled pull-up transistor 306 by isolation transistors 311 and 312. Including transistors 309 and 310 enables the isolation transistors 311 and 312 to share the clock-enabled pull-up transistor 306. Without the isolation transistors 311 and 312, and additional clock-enabled pull-up transistor would be required, increasing the clock load of the latch circuit 300 by 50%.

When the clk 320 is high transistors 307 and 302 act as an input inverter to drive the complement of input signal d 321 onto storage node sN 315. Transistors 303 and 308 act as an inverter to drive the complement of dN 323 onto the storage node s 318. Transistor 309 disables the pull-up of storage node sN 315 until the storage node s 318 has fallen in order to avoid a fight between transistors 304 and 307. Similarly, the transistor 310 disables the pull-up of storage node s 318 until the storage node sN 315 has fallen in order to avoid a fight between transistors 308 and 305.

While the clk 320 is high, the output signal Q 325 will follow the level of input signal d 321 as the input inverter formed by transistors 307 and 302 drives the complement of the level of input signal d 321 onto the storage node sN 315 and the input inverter formed by transistors 308 and 303 drives the level of input signal d 321 onto the storage node s 318. When the clk 320 falls, the storage sub-circuit captures the level of input signal d 321 and holds the level to generate the output signal Q 325 while the clk 320 is low. While the clk 320 is low, the input inverters within the propagation sub-circuit (transistors 307 and 302 and transistors 308 and 303) have no effect on the output signal Q 325. The clock-activated pull-down transistor 301 is deactivated when the clk 320 is low, preventing the d input signal 321 from pulling down the storage node sN 315. Pull-up of the low storage node sN 315 or s 318 is prevented by either transistor 309 or 310, respectively.

Figure 3B:
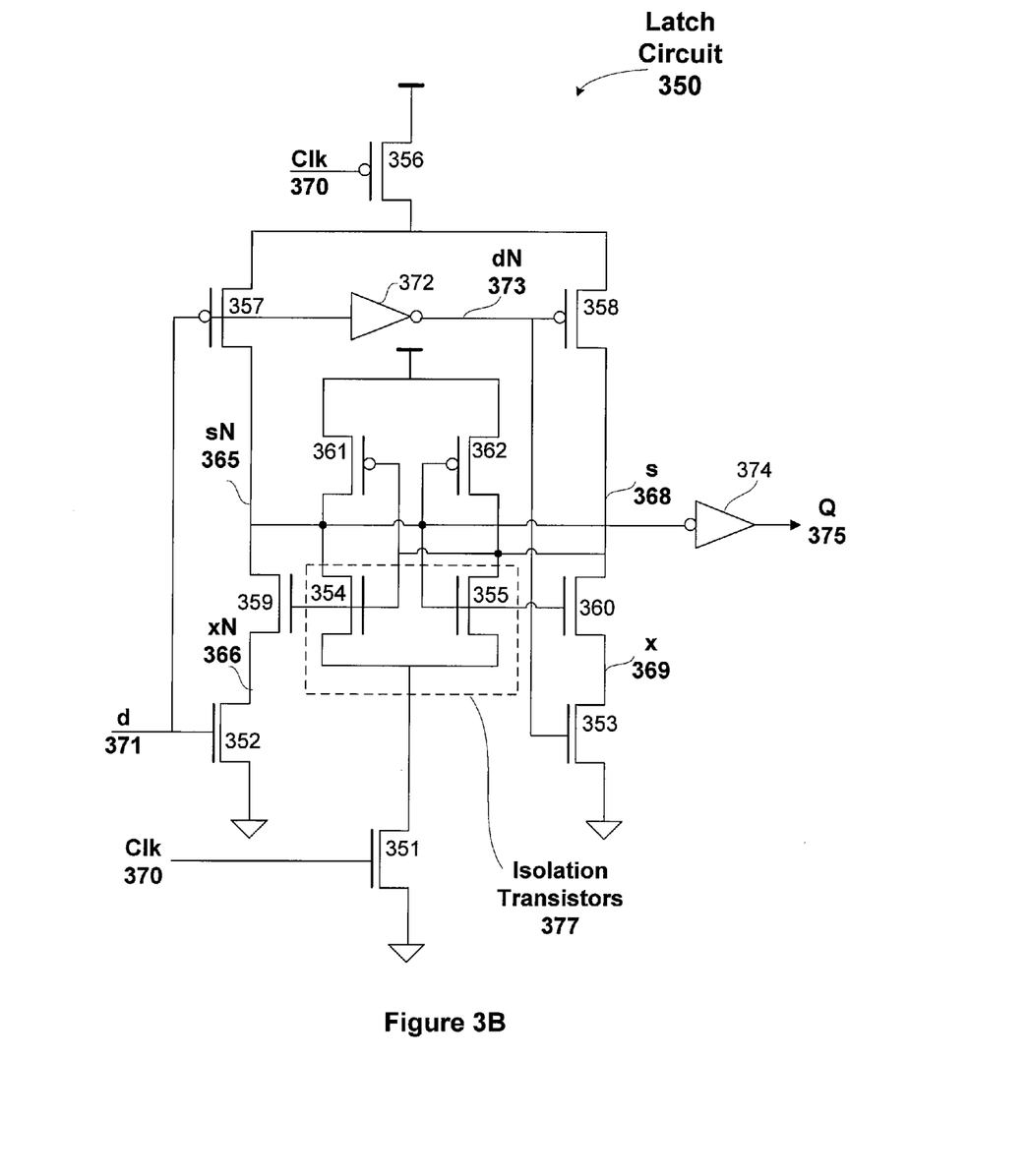
FIG. 3B illustrates a low-clock-energy latch circuit that is transparent when the clock signal is low, in accordance with one or more aspects of the present invention.

FIG. 3B illustrates a low-clock-energy latch circuit 350 that is transparent when the clock signal, clk 370 is low, in accordance with one or more aspects of the present invention. Like the latch circuit 300, the latch circuit 350 is also a fully-static, clock-energy-efficient latch that presents only two loads to the clock and which does not depend on transistor device size ratios. With only two minimum sized cloak loads, the latch circuit 350 should consume only a third or a quarter of the clock energy that is consumed by a conventional pass-gate latch. The total number of transistors included in the latch circuit 350 is sixteen, where each of inverters 372 and 374 include two transistors. Compared with the latch circuit 200 having the same number of transistors, the loads on the clock signal, Clk 370 are halved.

As shown in FIG. 3B transistors 351, 352, 353, 354, 355, 359, and 360 are NMOS devices and transistors 356, 357, 358, 361, and 362 are PMOS devices. Transistors 354, 355, 361, and 362 are configured as cross-coupled invertors that form a storage sub-circuit. A first inverter includes transistors 361 and 354 and a second inverter includes transistors 362 and 355. The transistor 351 is a clock-enabled pull-down transistor, that is configured to enable the storage sub-circuit by allowing current to flow to ground through either transistor 354 or 355 when the clock is high. The transistor 351 is shared between both inverters of the storage sub-circuit. Transistors 352, 353, 357, 358, 359, 360, and inverter 372 form propagation circuitry that passes the input signal d 371 to the output signal Q 375. The inverter 374 isolates Q 375 from the storage feedback loop of storage sub-circuit 377. When setup timing is not critical, synchronization performance is not important, and the load on the output Q 375 is low and static, inverter 374 may be omitted.

The transistor 356 is a clock-enabled pull-up transistor that is configured to activate the propagation circuitry to pass the input signal d 371 through to the output signal Q 375 when the clk 370 is low. Transistor 351 and transistor 356 are opposite polarities so that either the storage sub-circuit is enabled or the propagation circuitry is active in order to produce a fully-static circuit. The gates of transistor 360 and transistor 355 are coupled to each other and to node sN 365. Transistors 354 and 355 are isolation transistors 377. The gate and drain of transistor 354 are tied in parallel with the gate and drain of transistor 359 and transistor 354 is configured to isolate the drain of transistor 352 from the shared clock-enabled pull-down transistor 351. Similarly, the gate and drain of transistor 355 are tied in parallel with the gate and drain of transistor 360 and transistor 355 is configured to isolate the drain of transistor 353 from the shared clock-enabled pull-down transistor 351. Nodes x 369 and xN 366 are isolated from the shared clock-enabled pull-down transistor 351 by the isolation transistors 354 and 355. Including transistors 359 and 360 enables the isolation transistors 354 and 355 to share the clock-enabled pull-down transistor 351.

When the clk 370 is low, transistors 357 and 352 act as an input inverter to drive the complement of input signal d 371 onto storage node sN 365. Transistors 353 and 358 act as an inverter to drive the complement of dN 373 onto the storage node s 368. Transistor 359 disables the pull-down of storage node sN 365 until the storage node s 368 has risen in order to avoid a fight between transistors 361 and 352. Similarly, the transistor 360 disables the pull-down of storage node s 368 until the storage node sN 365 has risen in order to avoid a fight between transistors 353 and 362.

While the clk 370 is low, the output signal Q 375 will follow the level of input signal d 371 as the input inverter formed by transistors 357 and 352 drives the complement of d 371 onto the storage node sN 365 and the input inverter formed by transistors 358 and 353 drives the level of input signal d 371 onto the storage node s 368. When the clk 370 rises, the storage sub-circuit 377 captures the level of input signal d 371 and holds the level to generate the output signal Q 375 while the clk 370 is high. While the clk 370 is high, the input inverters within the propagation sub-circuit (transistors 357 and 352 and transistors 358 and 353) have no effect on the output signal Q 355. The clock-activated pull-up transistor 356 is deactivated when the clk 370 is high, preventing the d input signal 371 from pulling up the storage node sN 365. Pull-down of the high storage node sN 365 or s 368 is prevented by either transistor 359 or 360, respectively.

Figure 4:
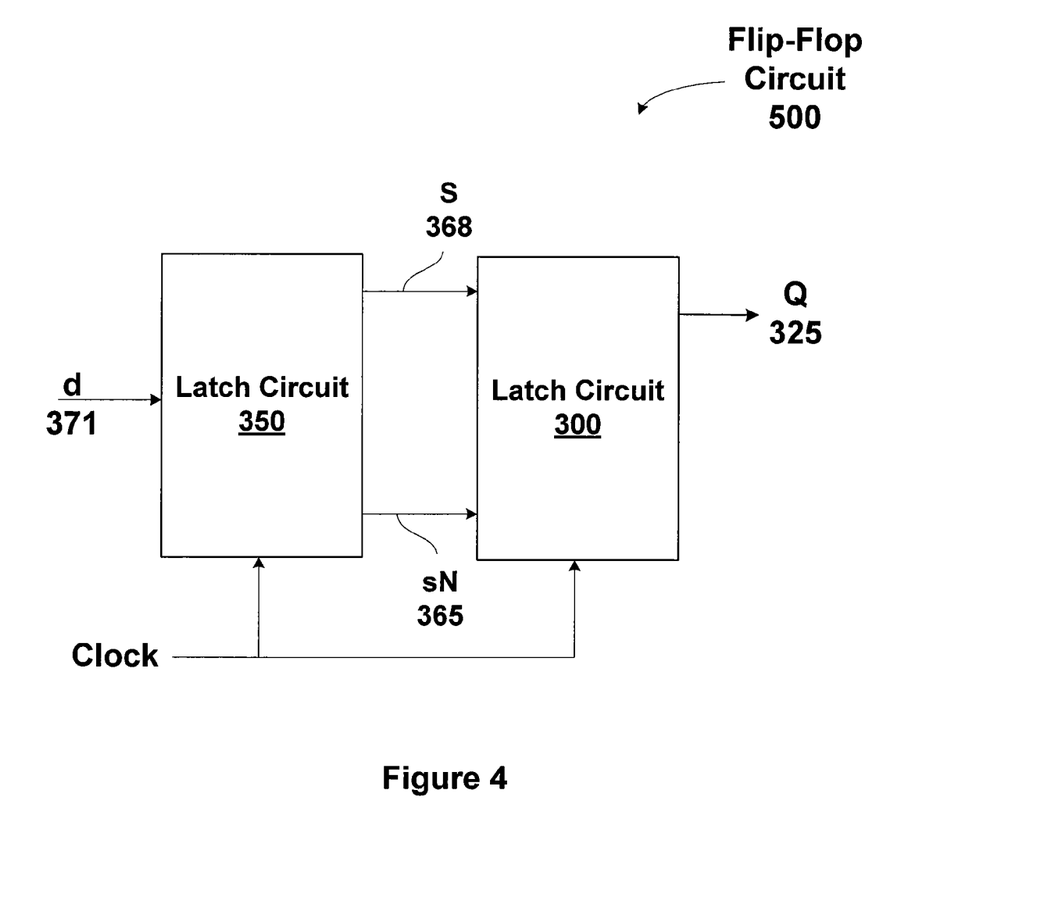
FIG. 4 is a block diagram illustrating a flip-flop constructed using the low-clock-energy latch circuits shown in FIGS. 3A and 3B, in accordance with one or more aspects of the present invention.

FIG. 4 is a block diagram illustrating a flip-flop circuit 500 constructed using the low-clock-energy latch circuits 300 and 350 shown in FIGS. 3A and 3B, in accordance with one or more aspects of the present invention. A clock signal is input to the clk 320 input of the latch circuit 300 and clk 370 of the latch circuit 350. Because latch 350 is transparent on clock low and latch 300 is transparent on clock high, a flip-flop can be realized without the need to invert the clock. The storage node s 368 from the latch circuit 350 is coupled to the input signal d 321 of the latch circuit 300 and the storage node sN 365 from the latch circuit 350 is coupled to the gate of transistor 303 of the latch circuit 300 (the inverter 322 may be omitted from the latch circuit 300). The inverter 374 may be omitted from the latch circuit 350.

Figure 5:
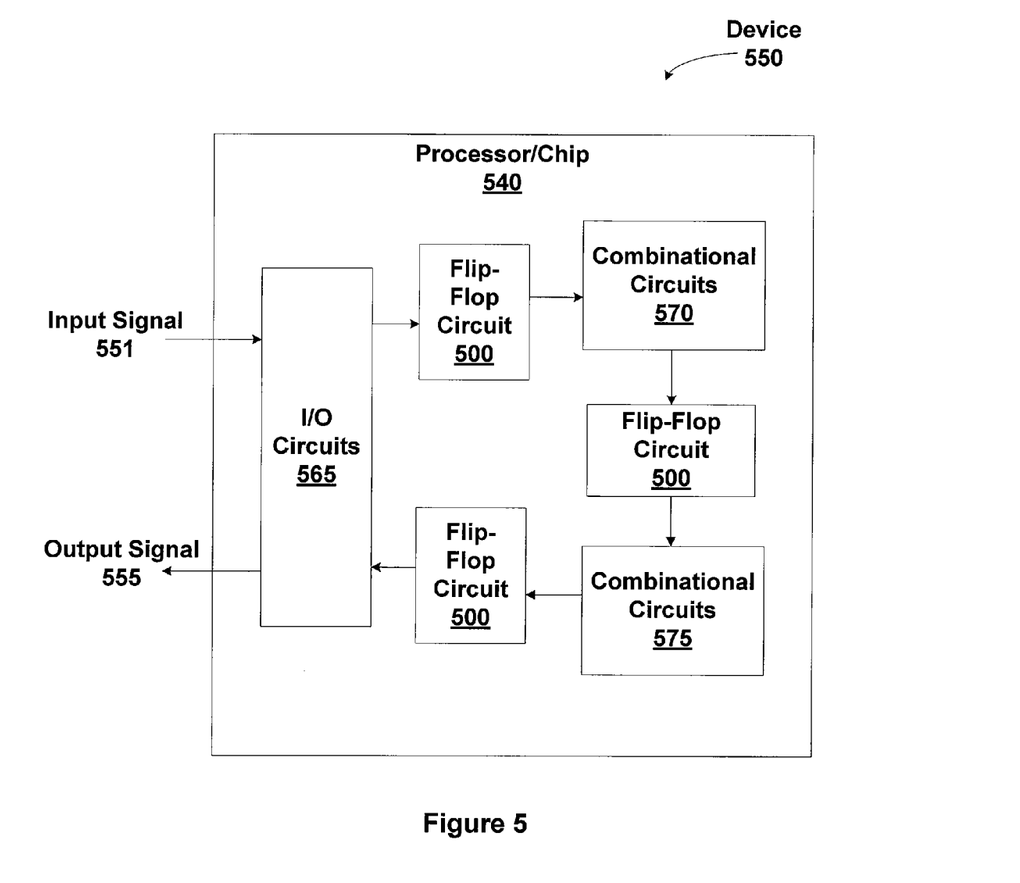
FIG. 5 is a block diagram illustrating a processor/chip including flip-flops from FIG. 4, in accordance with one or more aspects of the present invention.

FIG. 5 is a block diagram illustrating a processor/chip 540 including the flip-flop circuit 500 from FIG. 4, in accordance with one or more aspects of the present invention. I/O circuits 565 may include pads and other I/O specific circuits to send and receive signals from other devices in a system. Output signal 555 is produced by I/O circuits 565 based on signals received by the I/O circuits 565. The input signal 551 is received by the I/O circuits 565 and is input to the first flip-flop circuit 500 for storage. The I/O circuits 565 also provide clock signals to the flip-flop circuits 500. The combinational circuits 570 receive the output generated by the first flip flop circuit 500 and generate a combinational output that is received by the second flip-flop circuit 500. The second flip-flop circuit 500 stores the combinational output and generates an output that is input to the combinational circuits 572. The output of the combinational circuits 572 is received and stored by the third flip-flop circuit 500. The third flip-flop circuit 500 generates an output that is provided to the I/O circuits 565. The flip-flop circuits 500 may be used to store signals for multiple clock cycles or to pipeline signals that change as frequently as each clock cycle.

System Overview

Figure 6:
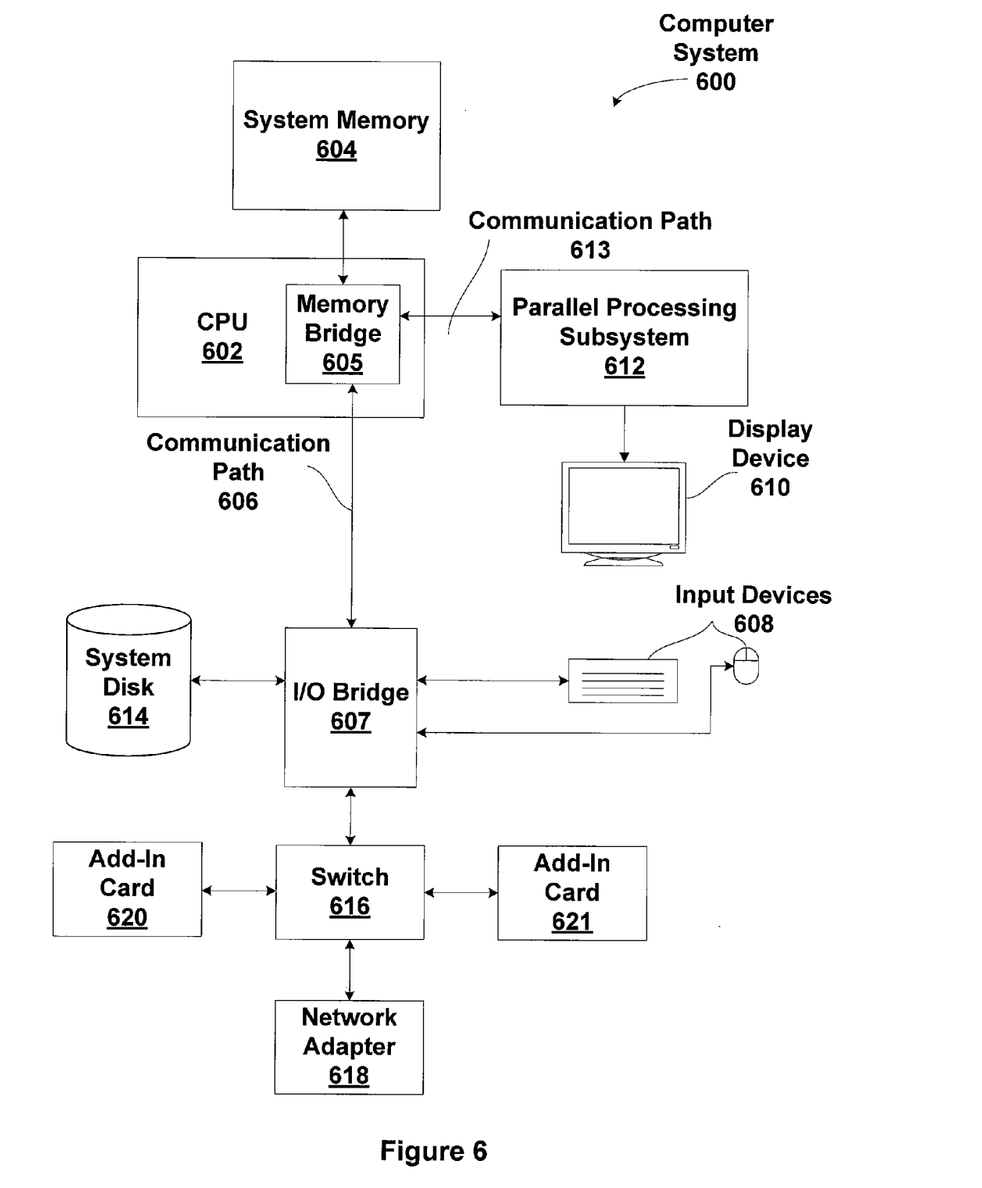
FIG. 6 is a block diagram illustrating a computer system configured to implement one or more aspects of the present invention.

FIG. 6 is a block diagram illustrating a computer system 100 configured to implement one or more aspects of the present invention. Computer system 600 includes a central processing unit (CPU) 602 and a system memory 604 communicating via a bus path through a memory bridge 605. Memory bridge 605 may be integrated into CPU 602 as shown in FIG. 6. Alternatively, memory bridge 605, may be a conventional device, e.g., a Northbridge chip, that is connected via a bus to CPU 602. Memory bridge 605 is connected via communication path 606 (e.g., a HyperTransport link) to an I/O (input/output) bridge 607. I/O bridge 607, which may be, e.g., a Southbridge chip, receives user input from one or more user input devices 608 (e.g., keyboard, mouse) and forwards the input to CPU 602 via path 606 and memory bridge 605. A parallel processing subsystem 612 is coupled to memory bridge 605 via a bus or other communication path 613 (e.g., a PCI Express, Accelerated Graphics Port, or HyperTransport link); in one embodiment parallel processing subsystem 612 is a graphics subsystem that delivers pixels to a display device 610 (e.g., a conventional CRT or LCD based monitor). A system disk 614 is also connected to I/O bridge 607. A switch 616 provides connections between I/O bridge 607 and other components such as a network adapter 618 and various add-in cards 620 and 621. Other components (not explicitly shown), including USB or other port connections, CD drives, DVD drives, film recording devices, and the like, may also be connected to I/O bridge 607. Communication paths interconnecting the various components in FIG. 6 may be implemented using any suitable protocols, such as PCI (Peripheral Component Interconnect), PCI-Express (PCI-E), AGP (Accelerated Graphics Port), HyperTransport, or any other bus or point-to-point communication protocol(s), and connections between different devices may use different protocols as is known in the art.

In one embodiment, the parallel processing subsystem 612 incorporates circuitry optimized for graphics and video processing, including, for example, video output circuitry, and constitutes a graphics processing unit (GPU). In another embodiment, the parallel processing subsystem 612 incorporates circuitry optimized for general purpose processing, while preserving the underlying computational architecture, described in greater detail herein. In yet another embodiment, the parallel processing subsystem 612 may be integrated with one or more other system elements, such as the memory bridge 605, CPU 602, and I/O bridge 607 to from a system on chip (SoC). One or more of CPU 602, parallel processing sub-system 612, I/O bridge 607, and switch 616 may include a low-clock-energy latch circuit 300 or 350 or a low-clock-energy flip-flop circuit 500.

It will be appreciated that the system shown herein is illustrative and that variations and modifications are possible. The connection topology, including the number and arrangement of bridges, may be modified as desired. For instance, in some embodiments, system memory 604 is connected to CPU 602 directly rather than through a bridge, and other devices communicate with system memory 604 via memory bridge 605 and CPU 602. In other alternative topologies, parallel processing subsystem 612 is connected to I/O bridge 607 or directly to CPU 602, rather than to memory bridge 605. In still other embodiments, one or more of CPU 602, I/O bridge 607, parallel processing subsystem 612, and memory bridge 605 may be integrated into one or more chips. The particular components shown herein are optional; for instance, any number of add-in cards or peripheral devices might be supported. In some embodiments, switch 616 is eliminated, and network adapter 618 and add-in cards 620, 621 connect directly to I/O bridge 607.

In sum, the low-clock-energy latch circuit 300 or 350 reduces the transistor device load to only two transistor gates and is fully static. The clock energy is reduced significantly compared with latch circuit having greater loads on the clock signal. The latch circuit is completely static and does not rely on sizing relationships between the different transistors. Therefore, the latch circuit operation is robust, even when the characteristics of the transistors vary due to the fabrication process.

One embodiment of the invention may be implemented as a program product for use with a computer system. The program(s) of the program product define functions of the embodiments (including the methods described herein) and can be contained on a variety of computer-readable storage media. Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored.

The invention has been described above with reference to specific embodiments. Persons skilled in the art, however, will understand that various modifications and changes may be made thereto without departing from the broader spirit and scope of the invention as set forth in the appended claims. The foregoing description and drawings are, accordingly, to be regarded in an illustrative rather than a restrictive sense.

The invention claimed is:

1. A low-clock-energy and fully-static latch circuit, comprising:
    a clock signal that is coupled only to a first clock-activated pull-up transistor and
    a second clock-activated pull-down transistor;
    a storage sub-circuit configured to capture a level of an input signal when the clock signal transitions from high to low and hold the level to generate an output signal while the clock signal is low, wherein the first clock-activated pull-up transistor is shared by a first isolation transistor and a second isolation transistor and enables the storage sub-circuit when the clock signal is low and disables the storage sub-circuit when the clock signal is high; and
    a propagation sub-circuit configured to receive the input signal and propagate the level of the input signal to generate the output signal while the clock signal is high, wherein the second clock-activated pull-down transistor activates the propagation sub-circuit when the clock signal is high and deactivates the propagation sub-circuit when the clock signal is low.

2. The low-clock-energy and fully-static latch circuit of claim 1, wherein the propagation sub-circuit comprises:
    a first input inverter that receives the input signal and is coupled to the clock-activated pull-down transistor and activated only when the clock signal is high; and
    a second input inverter that receives an inverted input signal and is coupled to the clock-activated pull-down transistor and activated only when the clock signal is high.

3. The low-clock-energy and fully-static latch circuit of claim 1, wherein the first isolation transistor is coupled to a gate and a drain of a transistor in the propagation sub-circuit and configured to isolate a source of the transistor from the first shared clock-enabled pull-up transistor.

4. The low-clock-energy and fully-static latch circuit of claim 1, wherein the second isolation transistor is coupled to a gate and a drain of a transistor in the propagation sub-circuit and configured to isolate a source of the transistor from the first shared clock-enabled pull-up transistor.

5. The low-clock-energy and fully-static latch circuit of claim 1, wherein operation of the storage sub-circuit and the propagation sub-circuit does not depend on sizing relationships between transistors.

6. The low-clock-energy and fully-static latch circuit of claim 1, further comprising an output inverter that is configured to isolate the output signal from a storage feedback loop within the storage sub-circuit.

7. The low-clock-energy and fully-static latch circuit of claim 1, wherein the storage sub-circuit includes:
    the first isolation transistor that is a PMOS transistor coupled between the first clock-activated pull-up transistor and a first storage node;
    a first NMOS transistor coupled between the first storage node and ground, wherein gates of the first PMOS transistor and the first NMOS transistor are coupled together forming a second storage node;
    the second isolation transistor that is a PMOS transistor coupled between the first clock-activated pull-up transistor and the second storage node; and
    a second NMOS transistor coupled between the second storage node and ground, wherein gates of the second PMOS transistor and the second NMOS transistor are coupled together at the first storage node.

8. A low-clock-energy and fully-static latch circuit, comprising:
    a clock signal that is coupled only to a first clock-activated pull-down transistor and a second clock-activated pull-up transistor;
    a storage sub-circuit configured to capture a level of an input signal when the clock signal transitions from low to high and hold the level to generate an output signal while the clock signal is high, wherein the first clock-activated pull-down transistor is shared by a first isolation transistor and a second isolation transistor and enables the storage sub-circuit when the clock signal is high and disables the storage sub-circuit when the clock signal is low; and
    a propagation sub-circuit configured to receive the input signal and propagate the level of the input signal to generate the output signal while the clock signal is low, wherein the second clock-activated pull-up transistor activates the propagation sub-circuit when the clock signal is low and deactivates the propagation sub-circuit when the clock signal is high.

9. The low-clock-energy and fully-static latch circuit of claim 8, wherein the propagation sub-circuit comprises:
    a first input inverter that receives the input signal and is coupled to the clock-activated pull-up transistor and activated only when the clock signal is low; and
    a second input inverter that receives an inverted input signal and is coupled to the clock-activated pull-up transistor and activated only when the clock signal is low.

10. The low-clock-energy and fully-static latch circuit of claim 8, wherein the first isolation transistor is coupled to a gate and a drain of a transistor in the propagation sub-circuit and configured to configured to isolate a source of the transistor from the first shared clock-enabled pull-down transistor.

11. The low-clock-energy and fully-static latch circuit of claim 3, wherein the second isolation transistor is coupled to a gate and a drain of a transistor in the propagation sub-circuit and configured to isolate a source of the transistor from the first shared clock-enabled pull-down transistor.

12. The low-clock-energy and fully-static latch circuit of claim 8, wherein operation of the storage sub-circuit and the propagation sub-circuit does not depend on sizing relationships between transistors.

13. The low-clock-energy and fully-static latch circuit of claim 8, further comprising an output inverter that is configured to isolate the output signal from a storage feedback loop within the storage sub-circuit.

14. The low-clock-energy and fully-static latch circuit of claim 8, wherein the storage sub-circuit includes:
   the first isolation transistor that is a PMOS transistor coupled between a first storage node and a voltage supply;
   a first NMOS transistor that is coupled between the first clock-activated pull-down transistor and the first storage node, wherein gates of the first PMOS transistor and the first NMOS transistor are coupled together forming a second storage node;
   the second isolation transistor that is a PMOS transistor coupled between the second storage node and the voltage supply; and
   a second NMOS transistor coupled between the second storage node and the first clock-activated pull-down transistor, wherein gates of the second PMOS transistor and the second NMOS transistor are coupled together at the first storage node.

15. A low-clock-energy and fully-static latch circuit, comprising:
   a first isolation transistor;
   a second isolation transistor having a source that is coupled to a source of the first isolation transistor;
   a third transistor having a gate that is coupled to a gate of the first isolation transistor and a drain that is coupled to the drain of the first isolation transistor;
   a fourth transistor having a gate that is coupled to a gate of the second isolation transistor and a drain that is coupled to the drain of the second isolation transistor;
   a fifth transistor having a drain that is coupled to the drain of the third transistor;
   a sixth transistor having a drain that is coupled to the drain of the fourth transistor and having a source that is coupled to a source of the fifth transistor;
   a first clock-activated transistor having a gate that is coupled to a clock signal and having a drain that is coupled to the source of the first isolation transistor and the source of the second isolation transistor; and
   a second clock-activated transistor having a gate that is coupled to the clock signal and having a drain that is coupled to the source of the fifth transistor and the source of the sixth transistor;
   the clock signal being coupled only to the first clock-activated transistor and the second clock-activated transistor.

16. The circuit of claim 15, wherein the first clock-activated transistor is configured as a pull-down device.

17. The circuit of claim 15, wherein the first clock-activated transistor is configured as a pull-up device.

18. The circuit of claim 15, wherein the first isolation transistor is configured as part of a first inverter and the second isolation transistor is configured as part of a second inverter, and an output of the first inverter is coupled to an input of the second inverter and an output of the second inverter is coupled to an input of the first inverter.

19. The circuit of claim 18, wherein the first inverter and the second inverter form a storage sub-circuit of a latch.

* * * * *